United States Patent [19]

Vasudevan et al.

[11] Patent Number: 5,792,716
[45] Date of Patent: Aug. 11, 1998

[54] THICK FILM HAVING ACID RESISTANCE

[75] Inventors: Subramanian Vasudevan, Goleta, Calif.; Srinivasan Sridharan, Strongsville; Gordon J. Roberts, Parma, both of Ohio

[73] Assignee: Ferro Corporation, Cleveland, Ohio

[21] Appl. No.: 801,978

[22] Filed: Feb. 19, 1997

[51] Int. Cl.$^6$ .............. C03C 3/074; C03C 8/12; C03C 8/16

[52] U.S. Cl. .............. 501/20; 501/14; 501/17; 501/21; 501/22; 501/23; 501/24; 501/25; 501/26; 501/76; 427/96; 427/101; 427/103; 428/210; 428/426

[58] Field of Search .............. 501/14, 15, 17, 501/20, 21, 22, 25, 26, 76, 77, 79, 23, 24; 156/89; 428/210, 325, 426; 427/96, 101, 103

[56] References Cited

U.S. PATENT DOCUMENTS

| | | |
|---|---|---|
| 3,888,692 | 6/1975 | Kuwayama .............. 501/76 |
| 3,973,975 | 8/1976 | Francel et al. .............. 501/76 |
| 4,140,612 | 2/1979 | Shults et al. .............. 204/195 G |
| 4,215,026 | 7/1980 | Login .............. 260/292 E |
| 4,420,338 | 12/1983 | Ortega .............. 106/20 |
| 4,508,834 | 4/1985 | Gliemeroth et al. .............. 501/77 |
| 4,743,302 | 5/1988 | Dumesnil et al. .............. 106/1.23 |
| 4,861,646 | 8/1989 | Barringer et al. .............. 428/210 |
| 4,949,065 | 8/1990 | Watanabe et al. .............. 338/308 |
| 4,985,176 | 1/1991 | Watanabe et al. .............. 252/521 |
| 5,013,360 | 5/1991 | Finkelstein et al. .............. 106/1.23 |
| 5,013,697 | 5/1991 | Akhtar .............. 501/46 |
| 5,066,621 | 11/1991 | Akhtar .............. 501/41 |
| 5,098,611 | 3/1992 | Honda et al. .............. 252/518 |
| 5,114,885 | 5/1992 | Hormadaly .............. 501/20 |

*Primary Examiner*—Michael Marcheschi
*Attorney, Agent, or Firm*—Rankin, Hill, Porter & Clark LLP

[57] ABSTRACT

The present invention provides a new and improved thick film paste for use as an acid resistant overglaze. In one preferred embodiment such paste includes a glass composition comprising in weight percent from about 30% to about 60% PbO, from about 5% to about 20% ZnO, from about 2% to about 20% $B_2O_3$, from about 4% to about 12% $Al_2O_3$, from about 5% to about 18% $SiO_2$, up to about 8% $ZrO_2$, up to about 8% $TiO_2$ and from about 9% to about 21% $Nb_2O_5$.

19 Claims, No Drawings

THICK FILM HAVING ACID RESISTANCE

TECHNICAL FIELD

The present invention concerns a new and improved material for use in the construction of electronic circuits and/or devices. More particularly, the invention concerns a thick film paste material for use as an overglaze that upon firing displays a high level of acid resistance and it is useful in the construction of electronic devices and circuits.

BACKGROUND

In many electronic applications there is a need to provide circuits or devices that display a high degree of resistance to acidic environments created by such things as chemically active fluxes, detergent baths, electroplating baths, environmental humidity, etc.

In the prior art, acid resistance has been achieved to some degree by forming a thick film paste using conventional lead-based electronic glasses and then applying the paste over the conventional dielectric, resistive or conductive materials that one is attempting to protect. In this manner, the thick film paste is being used as an overglaze to protect the base or underlying materials.

Unfortunately, the acid resistance of commercially available thick film overglaze materials has been nominal at best. However, the present invention provides a new and improved thick film material for use as an overglaze that provides excellent acid resistance.

SUMMARY OF THE INVENTION

The present invention provides a new and improved thick film material or overglaze paste for use as an acid resistant overglaze. In addition to displaying good acid resistance, the materials of the present invention have been found to enhance the surge properties of the resistor materials that they may be used to overglaze.

In a preferred embodiment, the overglaze includes a glass composition comprising in weight percent from about 5% to about 20% ZnO, from about 30% to about 60% PbO, from about 2% to about 20% $B_2O_3$, from about 5% to about 18% $SiO_2$, from about 4% to about 12% $Al_2O_3$, from about 0% to about 4% NiO and from about 0% to about 8% $ZrO_2$, from about 0% to about 8% $TiO_2$ and from about 9% to about 21% $Nb_2O_5$. Preferably, the level of $ZrO_2$ plus $TiO_2$ contained in the glass is at least 3% by weight of the glass.

The foregoing and other features of this invention are hereinafter more fully described and particularly pointed out in the claims, the following description setting forth in detail certain illustrative embodiments of the invention, these being indicative, however, of but a few of the various ways in which the principles of the present invention may be employed.

Detailed Description of Preferred Embodiments

The invention provides new and useful material systems for use in the overglaze protection of various underlying conventional conductive, resistor and dielectric materials. The overglaze materials of the present invention have also been found to enhance or improve the surge voltage properties of low ohm resistor materials that are coated with the overglaze. The overglaze materials of the present invention may be used in conjunction with a variety of conductive, resistor and dielectric materials and substrates, including but not limited to substrates comprising beryllia, aluminum nitride, glass/ceramic coated steel, alumina, glass/ceramic dielectric tape, etc.

The acid resistant material of the present invention includes a glass composition comprising PbO, $B_2O_3$, ZnO, $SiO_2$, $Al_2O_3$, NiO, $Nb_2O_5$ and at least one of $TiO_2$ or $ZrO_2$. Optional additional components include $CaF_2$, $Y_2O_3$, $CeO_2$, $La_2O_3$ and $P_2O_5$. Set forth in the table below are compositions for the glass employed in the present invention.

Glass Composition

| Component | % By Weight | Preferred |
|---|---|---|
| PbO | 30–60 | 33–58 |
| $B_2O_3$ | 2–20 | 4–11 |
| ZnO | 5–20 | 7–17 |
| $SiO_2$ | 5–18 | 6–15 |
| $Al_2O_3$ | 4–12 | 5–10 |
| NiO | 0–4 | .001–3 |
| $ZrO_2$ | 0–8 | 0–6 |
| $TiO_2$ | 0–8 | 0–7 |
| $Nb_2O_5$ | 9–21 | 10–18 |
| $CaF_2$ | 0–3 | 0–1.7 |
| $Y_2O_3$ | 0–6 | 0–4.5 |
| $CeO_2$ | 0–5 | 0–4.5 |
| $La_2O_3$ | 0–9 | 0–6.5 |
| $P_2O_5$ | 0–10 | 0–8 |
| $F_2$ | 0–5 | 0–4 |

Preferably, the level of a $ZrO_2$ plus $TiO_2$ is at least 3%, and more preferably the combined level of $ZrO_2$ and $TiO_2$ in the glass composition is at least 4% by weight of the glass. Also, preferably the combined weight of the alkaline earth containing components does not exceed about 8% by weight of the glass.

The glass preferably exhibits a thermal coefficient of expansion (TCE) of about 45 to about $95 \times 10^{-7}$ per °C. The $T_g$ of the glass is preferably about 350° C. to about 650° C.

In addition to the above stated components, it will be appreciated that the glass composition of the present invention may include by weight up to 10% $Bi_2O_3$ and up to 10% CdO as possible substitutions respectively for PbO and ZnO. Additionally, the glass may contain up to about 10% by weight, and preferably, up to 7% by weight of a combined weight of BaO plus CaO plus MgO plus SrO. Also, it will be appreciated that up to 5% by weight of oxides of copper, iron, cobalt and manganese can be substituted for the nickel oxide in the glass. Further, it will be appreciated that instead of a single glass, multiple glasses having a combined composition as set forth above may be utilized in the present invention.

The glass compositions of the present invention can be prepared in any conventional manner. For example, a mixture of the appropriate ingredients or precursors can be placed in a platinum crucible and melted (e.g., 1450° C.–1550° C.), the resulting glass composition is then poured onto cold steel rolls to form thin flakes suitable for milling. These flakes are then milled to a suitable particle size distribution (e.g., average particle size of about 3 to about 6 microns). It will be appreciated that a coarser particle size of 40–50 microns can be used in dip coating and spraying applications.

In order to produce a thick film paste the glass compositions are dispersed in a suitable conventional binder system to form a suitable paste.

The binder system is preferably an organic binder system and it is provided in an amount sufficient to disperse the solids in the binder and to at least temporarily bond the resultant composition to a substrate or surface prior to firing.

In practice, the solid components, i.e., the glass composition and any added glasses, fillers or expansion modifiers, are preferably present in the range of from about 40% to about 95% by weight of the paste composition, and the binder system is preferably present in an amount ranging from about 3% to about 50% by weight of such paste composition.

In addition to the glass composition and the binder, various conventional fillers or expansion modifiers and other glasses may be included in the overglaze. Examples of such fillers or expansion modifiers include zinc silicates, magnesium silicates, barium aluminum silicates, zirconium silicates, barium magnesium silicates, zirconia, alumina, silica, titania and mixtures of the foregoing.

The organic binder is usually an organic resin mixed with a suitable vehicle. The vehicle generally includes one or more solvents. Any essentially inert binder can be used in the practice of the present invention, including various organic liquids, with or without thickening and/or stabilizing agents and/or other common additives. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose in solvents such as pine oil, the monobutyl either of ethylene glycol monoacetate, and carbinol. The binder can contain volatile liquids to promote fast setting after application to the substrate.

It will be appreciated that the binder system may also comprise water and a water compatible binder. Any one of a number of commercially available water compatible binders may be utilized.

In one embodiment of the invention, the binder contains from about 0.1% to about 20% by weight resin and about 80% to about 99.9% by weight solvent or mixture of solvents. The resin can be ethyl cellulose or an acrylate resin (e.g., methyl methacrylate). The solvent can be terpineol, 2,4,4-trimethyl-1,3-pentanediol monoisobutylrate, N-methyl-2-pyrrolidone or mixtures thereof. The binder can include a thixotropic material, preferably at a concentration of less than about 0.25% by weight.

The inventive paste compositions are applied to a substrate or surface in accordance with the invention using techniques well-known to those skilled in the art. An example of such a technique is silk screening wherein the paste is forced through a fine mesh stainless steel screen in a desired pattern. Typically the size of such a screen varies from about 200 to about 325 mesh. Other examples include spraying, dipping, electro coating, spinning, brushing and application using a doctor blade.

Once the paste is applied to a circuit or device, the paste is then dried and fired in an oxidizing atmosphere at a peak temperature in the range of from about 450° C. to about 850° C., preferably from about 525° C. to about 800° C., and more preferably from about 550° C. to about 650° C. Preferably, firing at the peak temperature is maintained for about 8 to about 12 minutes, more preferably about 9 to about 11 minutes. The heat-up time is preferably about 20 to about 26 minutes, more preferably about 22 to about 26 minutes. The cool-down time is preferably about 22 to about 32 minutes, more preferably about 23 to about 29 minutes.

The oxidizing atmosphere can be air or any oxygen containing atmosphere. The term "firing" is used herein to mean heating to a temperature and for a time sufficient to volatilize (burnout) all of the organic material in the paste and to sinter the glass composition. Depending on the particular application, the paste may be applied and cofired with the underlying material that is being overglazed, or it may be applied and fired after the underlying material has been fired (i.e., used on a post fired basis).

In order to further illustrate the invention, the Examples below are provided. Unless otherwise indicated, in the following Examples, as well as throughout the entire specification and in the appended claims, all parts and percentages are by weight, and all temperatures are in degrees centigrade (° C.). While these examples will show one skilled in the art how to operate within the scope of this invention, they are not to serve as a limitation on the scope of the invention for such scope is only defined in the claims below.

EXAMPLE I

A glass having the following composition for use in a paste (average particle size of about 5 microns) was formed using conventional glass melting and processing techniques.

| Glass Composition | |
|---|---|
| Component | % by Weight |
| PbO | 45.35 |
| $B_2O_3$ | 7.96 |
| ZnO | 13.95 |
| $SiO_2$ | 12.15 |
| $Al_2O_3$ | 6.01 |
| NiO | 0.22 |
| $ZrO_2$ | 2.41 |
| $TiO_2$ | 1.55 |
| $Nb_2O_5$ | 10.40 |

EXAMPLE II

A thick film paste made in accordance with the present invention was then produced by mixing on a three roll mill the following materials.

| Component | % By Weight |
|---|---|
| Glass of Example 1 | 69.5 |
| $ZrO_2$ | 6.0 |
| $Cr_2O_3$ | 1.5 |
| V384* | 8.3 |
| V435* | 13.0 |
| V450* | 1.7 |

*Binder systems available from the Ferro Corporation of Cleveland, Ohio

EXAMPLE III

The thick film paste of Example II was screen printed and fired onto a 96% by weight alumina substrate to provide an area of coverage of 4 square inches and a thickness of about 17 microns. The substrate was then immersed in ALPHA 857 water washable flux. The sample showed a loss of only 0.0001% by weight after being immersed for an hour in the washable flux. This is excellent performance as compared to conventional overglaze products made with conventional lead-based electronic glasses.

EXAMPLE IV

A resistor material having a surge voltage of 2.9 kv was applied to an alumina aubstrate and then fired at 850° C. The resistor material was then overglazed with the thick film paste of Example II and then fired at 600° C. for 10 minutes. The overglazed system diplayed a surge voltage of 3.9 kv.

Other features and aspects of the invention will be appreciated by those skilled in the art upon reading and comprehending this disclosure. Such features, aspects and variations and modifications are clearly within the scope of this invention and this invention is limited solely by the scope of the following claims.

What is claimed:

1. A composition for use in producing an overglaze coating, said composition including a glass composition, said glass composition comprising in weight percent from about 30% to about 60% PbO, from about 2% to about 20% $B_2O_3$, from about 5% to about 20% ZnO, from about 5% to about 18% $SiO_2$, from about 4% to about 12% $Al_2O_3$, from about 0% to about 8.0% $ZrO_2$, from about 0% to about 8.0% $TiO_2$ and from about 9% to about 21% $Nb_2O_5$.

2. A composition as set forth in claim 1 wherein said glass composition comprises in weight percent from about 7% to about 17% ZnO, from about 33% to about 58% PbO, from about 5% to about 10% $Al_2O_3$, from about 6% to about 15% $SiO_2$, and from about 10% to about 18% $Nb_2O_5$, and said glass composition further comprises from about 0% to about 4% NiO.

3. A composition as set forth in claim 1 wherein said glass composition includes a combined weight percent of $ZrO_2$ and $TiO_2$ of at least 3%.

4. A composition as set forth in claim 1 wherein said glass composition includes a combined weight percent of $ZrO_2$ and $TiO_2$ of at least 4%.

5. A composition as set forth in claim 1 wherein said glass composition further comprises in weight percent from about 0.001% to about 3% NiO.

6. A thick film paste for use in producing an overglaze coating, said paste comprising from about 40% by weight to about 95% by weight of a solids portion comprising a glass composition and from about 3% by weight to about 50% by weight of a binder, said glass composition comprising in weight percent from about 30% to about 60% PbO, from about 2% to about 20% $B_2O_3$, from about 5% to about 20% ZnO, from about 5% to about 18% $SiO_2$, from about 4% to about 12% $Al_2O_3$, from about 0% to about 8.0% $ZrO_2$, from about 0% to about 8.0% $TiO_2$ and from about 9% to about 21% $Nb_2O_5$.

7. A thick film paste as set forth in claim 6 wherein said glass composition comprises in weight percent from about 7% to about 17% ZnO, from about 33% to about 58% PbO, from about 5% to about 10% $Al_2O_3$, from about 6% to about 15% $SiO_2$, and from about 10% to about 18% $Nb_2O_5$, and said glass composition further comprises from about 0% to about 4% NiO.

8. A thick film paste as set forth in claim 6 wherein said glass composition includes a combined weight percent of $ZrO_2$ and $TiO_2$ of at least about 4%.

9. A thick film paste as set forth in claim 6 wherein said binder comprises an organic resin dissolved in a solvent.

10. A thick film paste as set forth in claim 9 wherein said solvent comprises an aliphatic alcohol.

11. A thick film paste as set forth in claim 9 wherein said solvent comprises a terpineol.

12. A thick film paste as set forth in claim 6 wherein said binder comprises a resin selected from the group consisting of ethyl cellulose an acrylate resin and mixtures thereof.

13. A thick film paste as set forth in claim 6 wherein said glass composition further comprises in weight percent up to about 10% $P_2O_5$, up to about 9% $La_2O_3$, up to about 5% $CeO_2$, up to about 6% $Y_2O_3$, up to about 3% $CaF_2$, and up to 5% $F_2$.

14. A thick film paste as set forth in claim 6 wherein said glass composition further comprises in weight percent up to about 8% $P_2O_5$, up to about 6.5% $La_2O_3$ and up to about 1.7% $CaF_2$.

15. A thick film paste as set forth in claim 6 wherein said solids portion further comprises a filler or expansion modifier selected from the group consisting of zinc silicates, magnesium silicates, barium aluminum silicates, zirconium silicates, barium magnesium silicates, zirconia, alumina, silica, titania, and mixtures thereof.

16. A thick film paste as set forth in claim 6 wherein said glass composition further comprises up to 10% by weight $Bi_2O_3$ and up to 10% by weight CdO.

17. A thick film paste as set forth in claim 6, which upon firing, displays a TCE of from about 45 to about $95 \times 10^{-7}$ per ° C. and a $T_g$ of from about 350° C. to about 650° C.

18. A method of producing a substrate having an overglazed coating comprising the steps of:
   I. applying a coating material upon a substrate, said coating material comprising a material selected from the group consisting of a dielectric, a conductor or a resistor;
   II. applying a thick film paste as defined in claim 6 over said coating material;
   III. firing said thick film paste at a temperature of from about 450° C. to about 850° C. so as to produce the substrate having an overglazed coating.

19. A method as set forth in claim 18 wherein subsequent to said Step I and prior to Step II said substrate is fired.

* * * * *